United States Patent

Yongue

[15] 3,697,817

[45] Oct. 10, 1972

[54] MOUNTING ATTACHMENT FOR A MODULAR SUBSTRATE

[72] Inventor: James McIntire Yongue, Indianapolis, Ind.

[73] Assignee: RCA Corporation

[22] Filed: Jan. 25, 1971

[21] Appl. No.: 109,158

[52] U.S. Cl. ............317/101 CC, 174/68.5, 336/208

[51] Int. Cl. ............................................H05k 1/04

[58] Field of Search................200/166 PC; 174/68.5; 317/101 B, 101 C, 101 CB, 101 CC, 101 CM, 101 CP, 101 CX, 101 D; 336/208

[56] References Cited

UNITED STATES PATENTS

| | | | |
|---|---|---|---|
| 3,365,620 | 1/1968 | Butler et al. | 317/101 CP |
| 3,529,213 | 9/1970 | Farrand et al. | 317/101 CC |
| 3,443,257 | 5/1969 | Mollman | 336/208 |
| 3,560,257 | 2/1971 | Schneble et al. | 174/68.5 X |
| 2,989,665 | 6/1961 | Khouri | 317/101 C |
| 3,434,088 | 3/1969 | Zieles | 336/208 X |
| 2,493,199 | 1/1950 | Khouri et al. | 317/101 CX |
| 3,234,433 | 2/1966 | Braunagel | 317/101 D |
| 3,061,760 | 10/1962 | Ezzo | 317/101 C CX |
| 3,061,762 | 10/1962 | Schlegel | 317/101 CC |

*Primary Examiner*—J. R. Scott
*Attorney*—Eugene M. Whitacre

[57] ABSTRACT

An intermediate structure is used to mount such inductive elements as coils and transformers to a significantly larger module substrate. The intermediate substrate is provided with a metalization around its edges to afford an electrical connection between the leads of the inductive element—secured at the top of the intermediary—and the module substrate—to which the metallization at the bottom of the intermediary is electrically connected. The package so formed facilitates the construction of a ceramic circuit far more simply than if the inductive element were itself secured directly to a modular substrate of ceramic material.

7 Claims, 4 Drawing Figures

PATENTED OCT 10 1972 3,697,817

INVENTOR.
James M. Yongue
BY
Charles Brodsky
ATTORNEY

MOUNTING ATTACHMENT FOR A MODULAR SUBSTRATE

BACKGROUND OF THE INVENTION

1. Field of the Invention

This invention relates to miniaturized, electronic circuits fabricated from a flat ceramic substrate containing conductors formed by screen printing metallizing inks on its surface, in general, and to the mounting of such inductive elements as coils and transformers to the substrate in a manner which facilitates automatic production, in particular.

2. Description of the Prior Art

Such miniaturized, electronic circuits—and a method of their fabrication—are disclosed in pending U.S. Pat. application, Ser. No. 52,538, entitled "-METHOD OF MANUFACTURING THICK-FILM HYBRID INTEGRATED CIRCUITS", and assigned to the same assignee as is the invention of this application. As is therein described, conductors are formed on a ceramic substrate through a screen printing of metalizing inks, while resistors—and other components (e.g. capacitors) are mounted on the terminals of the conductors formed. Semiconductor chips containing diodes, transistors, or entire circuit networks, are also included, being separately mounted on the ceramic substrate and being connected to the screened-on portions of the circuit.

Also described in that pending application is the problem that has existed with respect to the electrical connection of such discrete components to their proper circuit leads; first of all, as respects the accompanying problems of precisely placing the electrodes so as to establish the desired connection and secondly, as respects the unwanted spreading of the soldering composition which connects other closely adjacent leads at the same time. Whereas the improved method disclosed in that Ser. No. 52,538 application facilitated the manufacture of hybrid circuits which included screen-printed resistors and capacitors, further improvement to facilitate the mounting of inductive elements such as coils and transformers are desired. This follows since the method commonly employed for attaching such inductive elements to the ceramic substrate are not readily applicable to mass production techniques.

For example, one method presently employed to effect such attachment is to solder the fine wires of the inductive element directly to the respective terminal connections of the substrate. Not only is it difficult and time consuming to work with such fine wires, but the amount of hear applied to the substrate to make the connection is unnecessarily high—first, because heat is generally applied to the substrate terminal while the wire is being positioned and secondly, because the heat must be sufficient to burn off the insulation on the leads of the inductive element. Such excess amount of heat has been found to literally burn off the metalization on the ceramic substrate, and in some instances burn out the transistors incorporated thereon as well. The magnitude of this problem is compounded for many terminal elements—such as an inductive delay line—where a plurality of leads must be secured to the ceramic substrate. In particular, the heat applied to any lead could create such burn off of metalization or destruction of transistors as would make the entire circuit unusable. Thus, a five lead inductive device, for example, offers 2½ times the possibility of causing a component to be rejected as would a two terminal device. Since a given circuit application might require a plurality of these inductive units to be attached to the ceramic substrate, the probability of component failures becomes more pronounced. Not only are such failures undesirable by themselves, but it will be seen that they occur in the latter stages of production, after all the screened-on resistors, capacitors and conductors have been formed and trimmed. Any resulting reject is thus of a substantially complete unit rather than one in its initial stages of manufacture.

SUMMARY OF THE INVENTION

As will become clear hereinafter, inductive elements are attached to a modular substrate in accordance with the present invention by means of an intermediate substrate upon which the inductive element is first mounted. This intermediate substrate is provided with metalization around its edges—from its top to its bottom—so that a conductive path is provided between the lead of the device secured at the top of the intermediate member and the bottom of the substrate. The intermediate substrate is provided with a key to facilitate its proper positioning with respect to the main substrate so that a single application of heat will assure both the mechanical and electrical connection between the metalization at its bottom surface and the appropriate terminals of the modular unit. Due to this physical alignment, the application of heat can exist for a shorter period of time, and will substantially offset any increased heat which might be needed because of the need to now connect an area metalization larger than a single lead. Such arrangement can facilitate mass production of complete circuits as automatic techniques can be applied to secure the metalization both to the intermediate substrate and to the inductive element and to cooperatively assemble the intermediate unit with the remainder of the modular construction.

BRIEF DESCRIPTION OF THE DRAWINGS

These and other advantages of the instant invention will become apparent from a consideration of the following description taken in connection with the accompanying drawings in which.

DETAILED DESCRIPTION OF THE DRAWINGS

Figure 1:
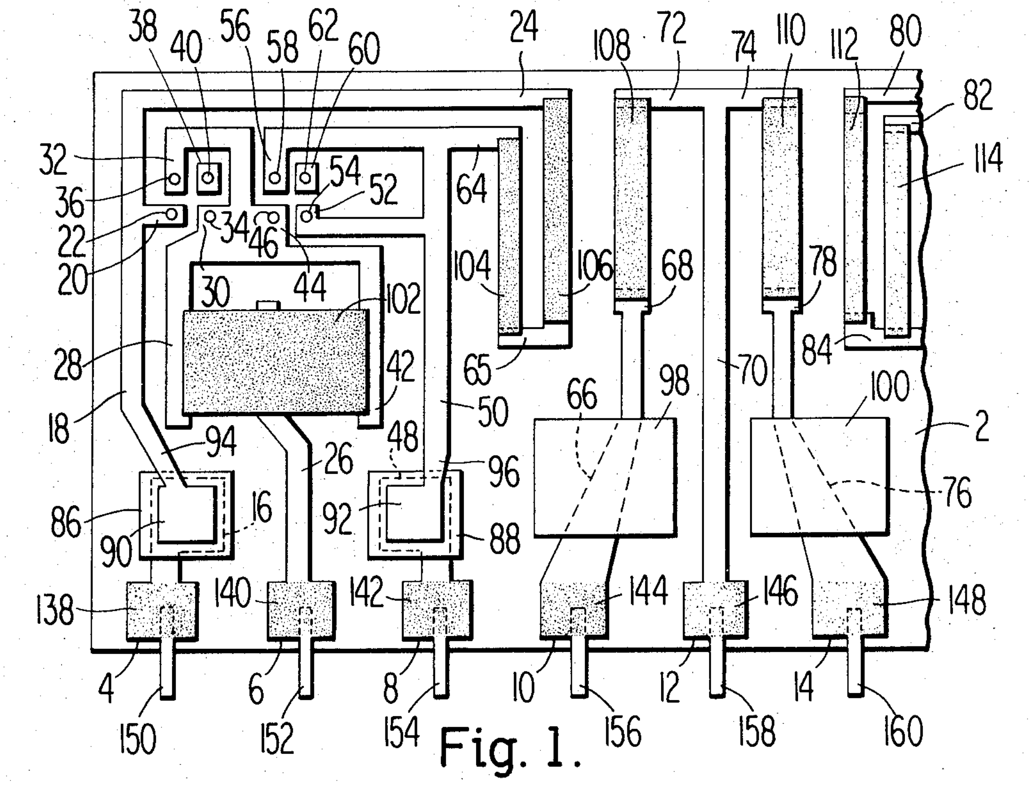
FIG. 1 is a top plan view showing a thick-film hybrid circuit of a type with which the mounting of an inductive element in accordance with the present invention is particularly applicable.

Referring now to the hybrid circuit of FIG. 1, it will be noted that such circuit is of the color diode demodulator type disclosed in the afore-mentioned pending application Ser. No. 52,538, and can be manufactured according to the method therein set forth. Thus, the circuit utilizes a ceramic substrate 2 which may be of any composition which is heat resistant, thermally conductive, electrically insulating, and with a low dielectric constant. One of the first steps in making such a circuit is to screen print a pattern of electrical conductors on the substrate—for example, from a composition comprising more than 50 percent by weight of powered silver and palladium, about 30–40 percent weight of a glass frit, a few percent by weight of an organic binder and sufficient solvent to make a printing composition of desired viscosity. After screen printing the pattern, the printed areas are allowed to dry to remove the solvent, and the assembly is then fired to burn off the organic binder and fuse the glass frit.

As shown in the drawing, such pattern of conductors includes a series of terminal pads 4, 6, 8, 10, 12 and 14 along one edge of the substrate 2, with terminal 4 being connected by the conductor pattern to the bottom electrode 16 of a capacitor. Adjacent to an edge of the capacitor electrode 16 is a conductor lead 18 which has a first branch 20 to become one of the connections to a diode component. As shown, the branch 20 has a solder dot 22 which will joined to a similar such dot on one of the diode electrodes, while the lead 18 has a second branch 24 to be connected to one end of a resistor.

Terminal pad 6 is likewise connected to a lead 26, part of which will become a terminal common to a pair of resistors. Another lead 28 becomes the other terminal of one of the resistors, and is connected to a pair of diode connections 30, 32 having solder dots 34 and 36, respectively. An additional connection 38 having a solder dot 40 is included to support such diode but has no electrical function in the circuit shown. Such type of diode mount is intended to be used with a particular type of planar transistor connected as a diode. In such arrangement, the conductor connection 20 is connected to the base electrode of the transistor while the conductor connections 30, 32 are connected to the collector electrode of the transistor.

In analagous manner, the conductor lead 42 is to become a connection to the other resistor of the resistor pair noted above, and is connected to a connection 44 of a second diode. As indicated, such diode connection has a solder dot 46.

Terminal 8 of the FIG. 1 drawing is shown connected to the bottom electrode 48 of a second screen-printed capacitor. Adjacent to such electrode 48 is further conductor lead 50 having a first branch 52, with a solder dot 54, which also serves as a connection to the second diode. A second branch 56 (and solder dot 58) of the conductor lead 50 serves as a third connection to the second diode. As with the diode above, this second such element also includes a non-electrical functional support connection 60 with the solder dot 62. The conductor lead 50, in this case, has a further, third branch 64 to be connected to one end of a resistor. An isolated terminal 65 will be connected as a common terminal to the two resistors which will also be connected at their opposite ends to branches 24 and 64.

Terminal pad 10 of the arrangement is illustrated as being connected to a conductor lead portion 66 which will become the bottom connection to a first ceramic chip capacitor. Lead portion 66 is, in turn, connected to a terminal portion 68 which will be connected to one end of a resistor. Terminal pad 12, similarly, is connected to a conductor lead 70 having resistor connection branches 72 and 74 while terminal pad 14 is connected to a lead conductor portion 76 which will become the bottom connection to a second ceramic chip capacitor. This lead portion 76 is, in turn, connected to a terminal portion 78 of another resistor, the opposite end of which will be connected to branch 74. Terminal connections 80, 82 and 84 are connected to additional resistors, as indicated.

FIG. 1 also illustrates the depositing of dielectric layers 86 and 88 over lower capacitor electrodes 16 and 18, respectively. This can be done by screen printing a ceramic composition, with a capacitor being completed by screen printing top electrodes 90, 92 over their associated dielectric layer 86, 88. The top electrode 90 is shown connected to the lead 18 by a bridging lead portion 94 while the top electrode 92 is similarly connected to the lead 50 by a bridging lead portion 96. After the metalizing operation, the assembly is again fired to fuse the glass frit, to burn off the organic matter, and to mature the ceramic.

As with the described method of that Ser. No. 52,538 application, the resistors noted above are screen printed, and—where of the same ink composition—are all printed in a single operation. A dual resistor 102 is illustrated in the drawing as being printed across the middle electrode connection 26 to overlap the two end connections 28 and 42. A like resistor 104 bridges the connection 64 and 65 while a third resistor 106 bridges the connections 24 and 65. A further resistor 108 is deposited between the connections 68 and 72, just as resistors 110 and 112 are deposited between connections 74, 78 and 80, 84, respectively. A resistor 114 is additionally shown being printed between the connections 82 and 84. In one arrangement described in the previously noted application—the disclosure of which is herein incorporated by reference—these resistors are all composed of the same ingredients as the conductive inks but with a lower proportion of powdered metal and a higher proportion of glass frit. After the resistors are deposited in the noted method of manufacture, the unit goes through another firing operation to fuse the glass frit and burn off the organic binder.

Such operations are then followed by an attachment of the bottom electrodes of the ceramic capacitors 98 and 100 to the lead portions 66, 76, respectively. This can be done by using a conductive cement composed of an epoxy resin and silver powder. Solder layers 138, 140, 142, 144, 146 and 148 are then applied after this operation to the terminal pads 4, 6, 8, 10, 12, 14, respectively, with external lead wires 150, 152, 154, 156, 158 and 160 being soldered thereto.

Although not shown in the drawing, it will be understood that the diodes to be mounted may be attached by matching solder dots on the semiconductor diode device to the solder dots 22, 34, 36, and 40 on the conductive pattern of the substrate. Similarly, if a planar transistor were to be mounted, additional matching of solder dots on such a device could be aligned with corresponding dots on the ceramic substrate 2, and connection made by a solder reflow technique.

While the method of manufacture described in the Ser. No. 52,538 application proves quite satisfactory in fabricating ceramic circuit chip of the type described, it has been found that problems are introduced when such inductive elements as coils and transformers are to be electrically connected to ceramic devices. In particular, it was found that the amount of heat necessary to burn the insulation on the leads of the inductive element to electrically connect it in circuit oftentimes was sufficiently high to burn off the conductor metalization. Additionally, the heat transferred by the metalization to the semiconductor transistors mounted on the ceramic substrate during the inductive connection could also be sufficiently high to destroy those components. This raising of temperature was further noted to be due not only to the amount of heat needed to melt the insulation, but also due to the application of heat during the time the assembler was manually aligning the inductive lead with its respective terminal in order to effect the connection.

Such manual positioning—and the problems associated therewith—are multiplied when the inductive element has a plurality of leads which must connected to the ceramic substrate, as each such connection could lead to the transistor destruction or metalization burn off noted. This could thus cause the circuit chip to be rejected, although the substrate had successfully undergone substantial manufacture in the laying of its conductor, resistor and capacitor patterns. While securement by automatic means can speed up the fabrication many times, it will be apparent that different constructions or modifications would be needed as the circuit arrangements requiring such connection will generally differ from one application to another, thus requiring different machine designs in each instance.

In accordance with the invention, on the other hand, such increase in production without this concomitant problem can be effected—and, in addition, without the heat problems previously noted—by first securing the leads of the inductive element to an intermediate substrate (for example, by providing a metalization around the edges of the intermediate unit from top to bottom and by fastening the inductive lead to the top of the metalization—either by welding or by soldering). The heat needed to effect this attachment is thus separated from the heat needed to secure the intermediate body to the main substrate—and, therefore, will not cause the metalization or transistor destruction problems previously noted. The metalization can be provided around each corner of a rectangularly shaped intermediate substrate in one automatic processing step, for instance, while the individual leads of the inductive element can be similarly secured to the metalization in a single, subsequent step.

Figure 2:
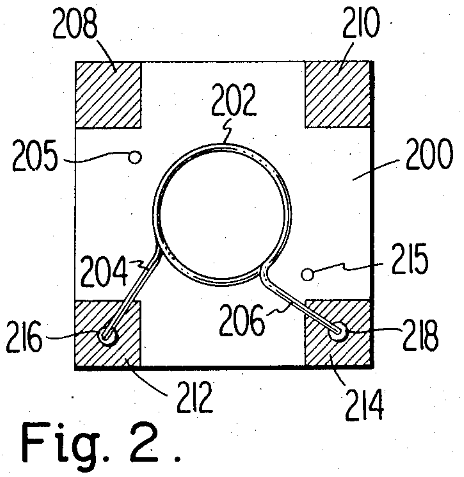
FIGS. 2–3 are top plan views of two such mounts in accordance with the invention.

Such intermediate substrate for a two-lead coil is shown in FIG. 2 where the intermediate substrate is represented by the notation 200, where the coil is represented by the notation 202 having leads 204, 206 and where the metalization pads are shown by the notations 208, 210, 212, and 214. As will be noted, the leads are connected only to the metalizations 212, 214, and by means of solder dots 216, 218.

Figure 3:
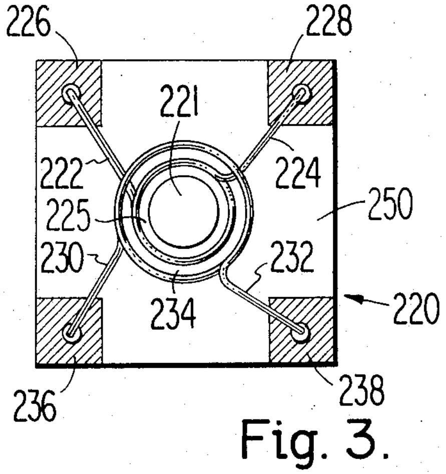

FIG. 3 shows a similar arrangement for a transformer 220 having a core 221, where the leads 222, 224 of its primary winding 225 are connected to metalization pads 226, 228 on substrate 250, while the leads 230, 232 of its secondary winding 234 are connected to the metalization pads 236, 238. In arrangements as shown in FIGS. 2 and 3 it will be appreciated that the metalization pads on the reverse side of the intermediary 200, 250 also include solder dots to make appropriate connection to the modular substrate when properly positioned and when sufficient heat is applied as will cause the solder to flow. To prevent such application of heat from similarly melting the connection of the inductive leads to the metalization of the intermediate substrates, the top solder connections (e.g. dots 216, 218) are composed of a higher temperature solder than the lower connections; a melting of the top solder connection will not, therefore, result when the application of heat to effect connection to the modular substrate is only at that temperature which will melt the bottom solder connection.

Figure 4:
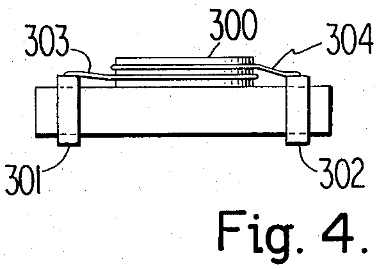
FIG. 4 is a side view of another mount embodying the invention.

The side view arrangement shown in FIG. 4 illustrates how a metalization procedes around the edges of an intermediate substrate. A two-terminal coil is represented by notation 300 with the individual metalizations being shown as 301, 302. In this instance, welding of the leads 303, 304 of the inductive elements is provided to effect the securement to the top side of the metalizations, with the bottom sides being eventually mounted on the ceramic substrate by a solder reflow technique of conventional design.

Such intermediate substrate components can be manufactured in large numbers by automatic machines designed only to connect the appropriate number of leads to the associated metalizations on the module chip. These intermediate substrates—with their attached elements—can then be stored as component parts themselves, just as individual discrete resistors and capacitors are stored. When the time comes to mount a particular coil, for example, one need only go to the proper bin to select that intermediate substrate component having the desired electrical characteristics.

The arrangement of the present invention further provides for ease of positioning the intermediate substrate by virtue of its having a key alignment (e.g. 205, 215 in FIG. 2) which facilitates the insertion of the intermediate substrate on the main module. Such alignment also facilitates the increase in productivity and, because of its automatic positioning, necessitates less application of heat to the module in order to effect the desired securement of the inductive element.

Additional advantages follow the use of an intermediate substrate of the same material as the main substrate—namely, the matching of thermal expansions and, with ceramic units for example, comparable fireproofing characteristics. By using the same type of ceramic material for both substrates, it will also be apparent that any scrap material resulting from the first processing of the modular ceramic substrate can be used in the later manufacture of the intermediate substrate. Whereas the amount of heat necessary to effect securement to the main module may be somewhat increased because of the relatively larger size metalization of the intermediary as compared to the inductive lead, the automatic positioning because of the larger, easier grasped configuration and key alignment tends to keep down the total temperature to which the metalization and transistor components will be subjected due to the reduced time needed to orient the mounting. The larger size configuration also simplifies the handling of the inductive component.

Two other significant advantages follow from the use of this intermediate substrate. One advantage results from the added separation between the inductive element and the surface of the ceramic module substrate. Such positioning serves to reduce the coefficient of coupling between the components on the ceramic substrate and the inductive element, by a factor of one-third to one-half for an intermediary of approximately 0.05 inch thickness. Similar separation between the two substrates by virtue of the edge metalization of the intermediate body also permits additional resistor, capacitor or conductor components to be screened-on the module ceramic between the pads of the intermediate unit, and without any substantial reduction of the Q of a coil, for example.

Furthermore, it will be appreciated that prior arrangements which employ a securing of the inductive element directly to the ceramic substrate is oftentimes followed by an encapsulation step to protect the circuit so formed against environmental contamination. Many times such encapsulation step would deleteriously affect and change the tuning to which the coil or transformer was aligned in its use with resonant circuits having screen printed capacitors. That is, since the resonant condition was established prior to the encapsulation step, such subsequent operation would adversely affect the alignment due to the compression the potting would have on the coil windings and to the change in the dielectric around its leads. With the intermediate substrate arrangement of the invention, on the other hand, encapsulation of the inductive element can be made during the making of the intermediate component and the circuit then aligned to resonate with that component. A further encapsulation of the entire ceramic substrate to protect against environmental hazards will then only slightly effect the resonant condition since the coil or transformer will not generally suffer the compression and dielectric problems noted above.

While there has been described what are considered to be preferred embodiments of the present invention, it will be readily apparent that modifications may be made without departing from the teachings herein. For example, whereas the present invention has been described in the context of mounting inductive elements such as coils, transformers and delay lines to a ceramic substrate it will be readily apparent that similar mountings can be made to other materials and, also, can be made of additional components, each mounting, however, being effected in accordance with the description herein. Thus, it is contemplated that the present invention be read in the light of the appended claims.

What is claimed is:

1. In combination:

a miniaturized electronic circuit fabricated from a thermally conductive, electrically insulating, low dielectric constant modular substrate having a pattern of electrical conductors and passive circuit components deposited thereon and with predetermined ones of said conductors terminating in metalization pads for the mounting of discrete circuit components;

an additional intermediate substrate provided with a metalization path to afford an electrical connection between individually spaced, electrically insulated portions of its top and bottom surfaces;

means securing the lead connections of discrete circuit components to selected electrically insulated portions on said top intermediate substrate surface, whereby electrical connection is made from said lead connection to selected portions on said bottom intermediate substrate surface via said metalization path; and means for mounting said selected portions on said bottom intermediate substrate surface to which electrical connection of said discrete circuit component is made in cooperative alignment with the metalization pads of said predetermined modular substrate conductors to which said circuit component is to be connected to complete an electrical circuit between a discrete component on the top surface of said intermediate substrate and various ones of said conductors and passive components deposited on said modular substrate;

whereby, with the cooperative alignment between said bottom intermediate substrate portions and said modular substrate metalization pads, the mechanical connection of discrete components to the conductors and components of said modular substrate is facilitated by necessitating less heat for such mounting than is required where such discrete components are mechanically connected directly to said metalization pads without employing an intermediate substrate.

2. The combination of claim 1 wherein said additional intermediate substrate is fabricated from the same thermally conductive, electrically insulating, low dielectric constant material as said modular substrate.

3. The combination of claim 2 wherein said first mentioned means secures the lead connections of inductive elements to selected electrically insulated portions on said top intermediate substrate surface for ultimate mounting with the metalization pads of said modular substrate to complete said electrical circuit.

4. The combination of claim 3 wherein said first mentioned means welds the lead connections of said inductive element to selected electrically insulated portions on said top intermediate substrate surface and wherein said second mentioned means mounts said selected portions on said bottom intermediate substrate surface in cooperative alignment with the metalization pads of predetermined modular substrate conductors by a solder reflow technique.

5. The combination of claim 3 wherein said first mentioned means solders the lead connections of said inductive element to selected electrically insulated portions on said top intermediate substrate surface and wherein said second mentioned means mounts said selected portions on said bottom intermediate substrate surface in cooperative alignment with the metalization pads of predetermined modular substrate conductors by a further solder reflow technique.

6. The combination of claim 3 wherein said intermediate substrate is keyed to correspond with appropriate portions of said modular substrate to facilitate the cooperative alignment between said selected portions on said bottom intermediate substrate surface and said predetermined modular substrate conductors.

7. The combination of claim 3 wherein said provided metalization path extends around the edges of said intermediate substrate.

* * * * *

UNITED STATES PATENT OFFICE
CERTIFICATE OF CORRECTION

Patent No. 3,697,817 Dated 10-10-72

Inventor(s) James McIntire Yongue

It is certified that error appears in the above-identified patent and that said Letters Patent are hereby corrected as shown below:

Column 1, Line 22 - after "resistors--" insert "also usually formed by screen printing resistive compositions--".

Column 1, Line 53 - change "hear" to -- heat --.

Column 3, Line 5 - change "powered" to -- powdered --.

Column 3, Line 6 - after "30-40%" insert -- by --.

Signed and sealed this 1st day of May 1973.

(SEAL)
Attest:

EDWARD M. FLETCHER, JR.
Attesting Officer

ROBERT GOTTSCHALK
Commissioner of Patents